US006184724B1

United States Patent
Lin

(10) Patent No.: US 6,184,724 B1
(45) Date of Patent: Feb. 6, 2001

(54) VOLTAGE DETECTION CIRCUIT

(75) Inventor: Jin-Lien Lin, Cupertino, CA (US)

(73) Assignee: Macronix International Co., Ltd., Hsinchu (TW)

( * ) Notice: Under 35 U.S.C. 154(b), the term of this patent shall be extended for 0 days.

(21) Appl. No.: 09/212,897

(22) Filed: Dec. 16, 1998

(51) Int. Cl.[7] .................................................... H03K 5/22
(52) U.S. Cl. ............................................. 327/80; 327/143
(58) Field of Search .................................... 327/142, 143, 327/198, 530, 538, 540, 541, 543, 72, 77, 80, 81

(56) References Cited

U.S. PATENT DOCUMENTS

| 4,309,627 | * | 1/1982 | Tabata ................................. 307/362 |
| 5,214,316 | * | 5/1993 | Nagai ................................. 307/272.3 |
| 5,378,936 | * | 1/1995 | Kokubo et al. ......................... 327/77 |
| 5,581,206 | * | 12/1996 | Chevallier et al. ................... 327/143 |

* cited by examiner

Primary Examiner—Toan Tran
Assistant Examiner—Linh Nguyen
(74) Attorney, Agent, or Firm—Mark A. Haynes; Haynes & Beffel LLP

(57) ABSTRACT

A voltage detector circuit of a nonvolatile memory integrated circuit for determining the voltage potential of a supply voltage is provided. The voltage detector includes a first MOS device, a second MOS device, a bias circuit for adjusting the current through the first and second MOS devices that is responsive to the level of the supply voltage, and an output circuit that provides an output signal indicating the level of the supply voltage. The bias circuit may comprise a voltage divider circuit which provides a predetermined ratio of the supply voltage to the gate of one or both of the MOS devices. The voltage divider circuit may comprise MOS devices configured as resistive devices in series. The current through the MOS devices is provided to the output circuit, and the output circuit utilizes a measure of the difference in the current levels to determine the level of the voltage supply and provide the appropriate output signal. The output circuit may comprise a current mirror circuit that tries to equate the current flowing through the first and second MOS devices, and a gain stage. The gain stage may comprise a series of CMOS inverters to boost the output signal which in one case is a CMOS high signal when the supply voltage is greater than some predetermined voltage and is a CMOS low signal when the supply voltage is less than some predetermined voltage. In one embodiment the $V_{TH}$ and aspect ratios of the first and second MOS devices are equal. However, in other embodiments, the $V_{TH}$ and aspect ratios may be changed so as to act in combination with the bias circuit to adjust the currents in response to the level of the voltage supply. The detector may also include a drain voltage controller which acts in combination with the bias circuit to adjust the currents.

42 Claims, 4 Drawing Sheets

VOLTAGE DETECTION CIRCUIT

BACKGROUND OF THE INVENTION

1. Field of the Invention

The present invention relates to the detection of voltage levels on an integrated circuit such as a flash EEPROM. More particularly, this invention relates to a method and apparatus for detecting the supply voltage level where the power supply voltage may be less than the read potential required for sensing data in the memory of a flash EEPROM array.

2. Description of Related Art

As the market for personal computers has expanded, computer manufacturers have supplied the increasing demand with a continuous supply of new and better products. For instance, manufacturers continue to produce laptop computers that are smaller, lighter and more powerful. This has led to a need to reduce the power used by portable computers.

The integrated circuits that make up a large part of laptop computers have in the past been manufactured in order to work with a power supply voltage of about 5 volts, within a specified range of +/−10%. Of course other power supply voltages have been utilized. In order to reduce power consumption and extend battery life, much of the integrated circuitry used in personal computers is being redesigned to run at lower voltage levels. This reduces the power usage and allows more components to be placed closer to one another in the circuitry. For example, one low supply voltage which is emerging as a standard is specified to operate over a range of about 2.7 to 3.6 volts (hereinafter referred to as a 3 volt source). Other standards are being developed around even lower voltages. Thus, because of the many different combinations of components available in the present market, it is desirable to provide circuitry which is capable of functioning in systems providing either five volt, three volt, or five and three volt sources.

One computer component that is finding wide use in portable computers and that is affected by the level of the external voltage supply is the flash EEPROM array. Flash EEPROMs are a growing class of nonvolatile storage integrated circuits that may be used to provide a new form of long term random access storage which may replace electromechanical hard disk drives. These flash EEPROMs have the capability of electrically erasing, programming or reading a memory cell in the chip. The entire array can be simultaneously erased electrically. The flash EEPROM can also be randomly read or written.

The cells themselves use only a single transistor device per cell and are formed using so-called floating gate field effect transistors in which the data is stored in a cell by charging or discharging the floating gate. The floating gate is a conductive material, typically made of polysilicon, which is insulated from the channel of the transistor by a thin layer of oxide or other insulating material, and insulated from the control gate wordline of the transistor by a second layer of insulating material.

The act of charging the floating gate is termed the "program" step for a flash EEPROM. This is typically accomplished through a so-called hot electron injection by establishing a large positive voltage between the gate and source of the transistor, as much as 12 volts, and a positive voltage between the drain and source of the transistor, for instance, 6 volts. The act of discharging the floating gate is called the "erase" function for a flash EEPROM. This erasure function is typically carried out by a Fowler-Nordheim (F-N) tunneling mechanism between the floating gate and the source of the transistor (source erase) or between the floating gate and the substrate (channel erase). For instance, a source erase operation is induced by establishing a large positive voltage from the source to gate, while floating the drain of the respective memory cell. This positive voltage may be as much as 12 volts.

Given that flash EEPROMs can be programmed or erased by applying voltage to the device, systems incorporating flash EEPROMs often design capabilities to program and erase the flash EEPROMs. In order for a system to provide capabilities to program and erase the flash EEPROMs, the system has to provide not only a $V_{CC}$ voltage but also a $V_{PP}$ voltage. $V_{CC}$ is generally a 5 volt or 3 volt supply for controlling the logic in the read mode of the nonvolatile memory device. $V_{PP}$ is a 12 volt supply used in combination with $V_{CC}$ for controlling the programming and erasing modes of the nonvolatile memory device.

In order to provide the higher voltages necessary to program and erase flash EEPROM memory arrays, charge pump circuitry can be utilized. Charge pumps typically increase voltage available by pumping the voltage to a higher level. In the typical case, a five volt or three volt external source is pumped to twelve volts to provide voltages for programming and erasing. However, in a read operation, the word lines which supply a gate potential to memory cells are often designed to operate at a read potential of 4 volts or more. Thus, a low power supply voltage of 3 volts may be insufficient to directly supply an on chip voltage high enough to drive the word lines. This problem is dealt with by including charge pumps or other voltage supply boosters on the integrated circuits in order to supply the higher working voltages on chip.

Therefore, in such circuits, it is necessary to know the level of voltage available in order to know whether to pump the supply voltage to a higher value to read the array. U.S. Pat. No. 5,559,717, entitled "High Precision Voltage Detector Utilizing Flash EEPROM Memory Cells", invented by Tedrow et al., reveals a prior art apparatus that attempts to solve the above problem. This patent discloses the use of two flash memory cells (which consist of essentially identical floating gate FET devices) of a flash EEPROM, each with a different programmed switching voltage, in order to detect the level of the EEPROM's supply voltage. However, this detection scheme is subject to inaccuracy due to the inherent potential disturb problem of the flash memory cells. This could cause the detector voltage to be more susceptible to drift over time. Further, this apparatus requires a means for actively programming the flash cells to different voltages. This adds complexity and additional circuitry to the detector where space is at a premium, and also results in the consumption of additional testing time as the flash cells are programmed.

Accordingly, there is the need for an apparatus that is capable of detecting the voltage level of an external voltage supply to a computer component that improves upon and overcomes the problems and disadvantages of the prior art. In particular, there is the need for a device that can accurately, quickly, and reliably determine the level of a flash EEPROM supply voltage such that the flash EEPROM circuitry can be optimally designed. Further, the device needs to be free from the negative effects of floating gate FET time drift and the extra time and space requirements inherent in a voltage detector utilizing programmed switching of FET's.

SUMMARY OF THE INVENTION

The present invention provides a voltage detector circuit for determining the potential of a supply voltage that is provided on an input node to a circuit. The present invention is especially suited for use in detecting the voltage level of a voltage supplied to an integrated circuit such as a Flash EEPROM. Thus, this invention is also especially suited for use in computer systems such as portable laptop computers that use Flash EEPROMS, for instance, as memory devices.

The voltage detector circuit of the present invention includes a first MOS device that is operably coupled to an input node and configured in order to flow a current through the first MOS device. Also included is a second MOS device that is operably coupled to the input node and configured to flow a current. Further, the voltage detector includes a bias circuit that is coupled to the first MOS device and the second MOS device. The bias circuit acts in combination with the first MOS device and the second MOS device in order to adjust the levels of the currents through the first and second MOS devices in response to the potential of the supply voltage. The circuit is designed such that when the potential of the supply voltage is greater than a first potential the difference between the level of the currents through the first and second MOS devices is less than the difference between the currents when the supply voltage is less than a first potential. Lastly, an output circuit is provided that receives the currents through the first and second MOS devices and generates an output signal that indicates the potential of the supply voltage in response to the difference between the level of the currents.

In one embodiment of the present invention, the output circuit is configured such that when the potential of the supply voltage is greater than the first potential the output signal comprises a high CMOS logic signal, and when the potential of the supply voltage is less than the first potential the output signal comprises a low CMOS logic signal. In another embodiment, the output circuit is configured such that the reverse is true, when the potential of the supply voltage is greater than the first potential the output signal comprises a low CMOS logic signal, and when the potential of the supply voltage is less than the first potential the output signal comprises a high CMOS logic signal.

In one embodiment of the invention, the first MOS device comprises a p-channel MOS transistor characterized by a first gate-source voltage, a first threshold voltage, and a first aspect ratio, and the second MOS device comprises a p-channel MOS transistor characterized by a second gate-source voltage, a second threshold voltage, and a second aspect ratio. In another embodiment, the first and second MOS devices comprise n-channel devices.

The bias circuit may be further characterized as comprising a voltage divider circuit. The voltage divider circuit is configured to provide a first ratio of the potential of the supply voltage to the gate of the first MOS device and to provide a second ratio of the potential of the supply voltage to the gate of the second MOS device. Further, the voltage divider circuit may comprise MOS transistors, such as p-channel transistors in one embodiment and n-channel transistors in another embodiment, configured as linear resistive elements. In an embodiment where the first and second MOS devices are p-channel devices, the voltage divider circuit provides voltages to the gates of these devices such that the absolute value of the first gate-source voltage is greater than the absolute value of the second gate-source voltage.

In one embodiment of the present invention, the $V_{TH}$ of the first and second MOS devices are approximately equal. Alternatively, the first MOS device comprises a first threshold determinant that determines the level of the first threshold voltage, and the second MOS device comprises a second threshold determinant that determines the level of the second threshold voltage. In this embodiment, the value of the first threshold voltage is different than the value of the second threshold voltage, and the difference between the value of the first threshold voltage and the value of the second threshold voltage comprises a threshold factor. This threshold factor serves to act in combination with the bias circuit to adjust the levels of the currents through the first and second MOS devices in response to the potential of the supply voltage.

In one instance, the first threshold determinant can be further characterized as comprising a first p-type source and drain terminal doping concentration, and the second threshold determinant as comprising a second p-type source and drain terminal doping concentration that is different than the first doping concentration. In another instance, the first threshold determinant can be further characterized as comprising a first p-type source and drain material, and the second threshold determinant as comprising a second p-type source and drain material that is different than the first material.

In one embodiment of the present invention, the aspect ratio of the first and second MOS devices are approximately equal. Alternatively, the first MOS device comprises a first aspect ratio determinant that determines the level of the first aspect ratio, and the second MOS device comprises a second aspect ratio determinant that determines the level of the second aspect ratio, wherein the value of the first aspect ratio is different than the value of the second aspect ratio. In this embodiment, the difference between the value of the first aspect ratio and the value of the second aspect ratio comprises an aspect ratio factor. This aspect ratio factor acts in combination with the bias circuit to adjust the levels of the currents through the first and second MOS devices.

In one instance, the first aspect ratio determinant can be further characterized as comprising a first gate width of the first MOS device, and the second aspect ratio determinant as comprising a second gate width of the second MOS device. In another instance, the first aspect ratio determinant can be further characterized as comprising a first gate length of the first MOS device, and the second aspect ratio determinant as comprising a second gate length of the second MOS device.

In another embodiment of the present invention, the voltage detector may also comprise a drain voltage controller circuit. This drain voltage controller is coupled to the drain terminals of the first MOS device and the second MOS device, and the controller circuit acts in combination with the bias circuit to adjust the levels of the currents through the MOS devices in response to the potential of the supply voltage.

The present invention may also be further characterized as comprising a third MOS device coupled to a fourth MOS device so as to form a current mirror as part of its output circuit. In one embodiment, the third and fourth MOS devices are n-type transistors, and in an alternative embodiment are p-type transistors. The output circuit may be still further characterized as comprising a gain stage electrically coupled to the current mirror. In one embodiment, this gain stage comprises at least one CMOS inverter.

Alternatively, the present invention can be characterized as a method of detecting the voltage potential of a supply voltage that is provided on an input node. This method comprises providing a first current through a first MOS device and providing a second current through a second MOS device. This method also comprises adjusting the level of the first current and the level of the second current in response to the potential of the supply voltage.

The adjustment is made such that when the potential of the supply voltage is greater than a first potential the difference between the level of the first current and the level of the second current comprises a first current difference, and when the potential of the supply voltage is less than the first potential the difference between the level of the first current and the level of the second current comprises a second current difference that is greater than the first current difference.

The method further comprises providing an output circuit which receives the first current and the second current and comparing the level of the first current and the second current. Lastly, the method includes the steps of determining the difference between the level of the first current and the level of the second current, and generating an output signal that indicates the potential of the supply voltage in response to the difference between the level of the first current and the level of the second current.

Accordingly, an apparatus and method of detecting the voltage level of a supply voltage provided to an input node has been provided. This apparatus is especially useful for detecting voltages provided to integrated circuits such as a Flash EEPROM, and therefore is accordingly especially suited for use in computer systems such as those found in portable laptop computers. By utilizing the current characteristics of p-channel and/or n-channel MOS transistors, the present invention defeats the problems of accuracy and speed inherent in the use of floating gate transistor programmed switching found in the prior art.

Other aspects and advantages of the present invention can be seen upon review of the figures, the detailed description, and the claims which follow.

BRIEF DESCRIPTION OF THE DRAWINGS

The figures illustrate the invention by way of example, and not limitation. Like references indicate similar elements.

DETAILED DESCRIPTION

Figure 1:
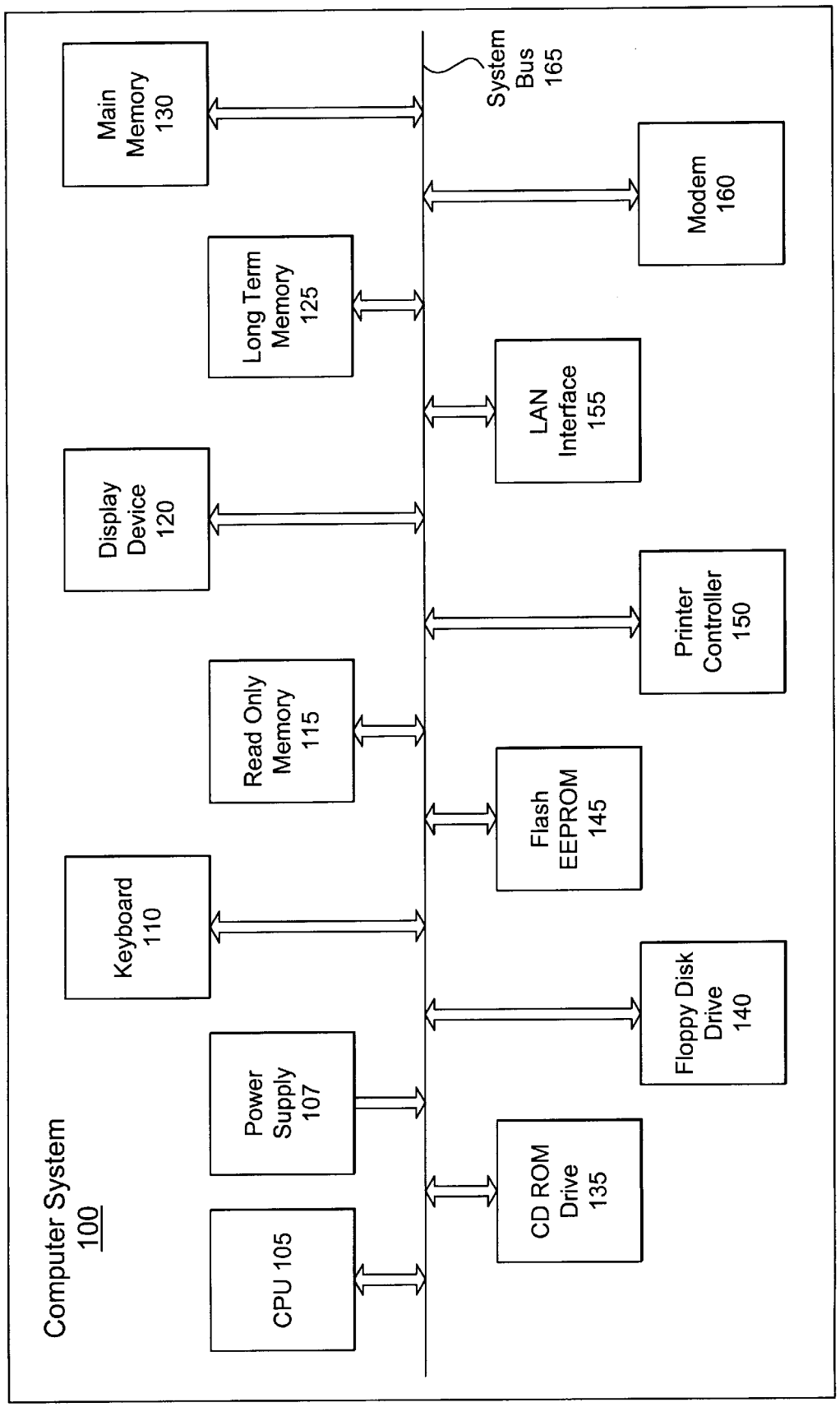
FIG. 1 illustrates, in block diagram form, a typical computer system that incorporates the elements of one embodiment of the present invention.

A detailed description of preferred embodiments is provided with respect to the figures in which FIG. 1 provides an overview of a computer system 100 that incorporates the elements of one embodiment of the present invention. The computer system 100 includes a central processing unit (CPU) 105, a power supply 107, a keyboard 110, a read only memory 115, a display device 120, a long term memory 125, a main memory 130, a CDROM drive 135, a floppy disk drive 140, a Flash EEPROM 145, a printer controller 150, a LAN interface 155, and a modem 160, all of which are coupled to a system bus 165. The system bus 165 is configured to carry data to and from the various components of the computer system 100.

The CPU 105 carries out the various instructions provided to the computer system 100 and controls other system components that are attached to the bus 165. Joined to the bus 165 is a main memory 130 which is typically constructed of a dynamic random access memory arranged in a well known manner to store information when the computer system 100 is powered on. Also connected to the bus 165 is a read only memory 115 which may include various well known memory devices and which is adapted to retain a particular memory condition when the computer system 100 is powered down. The read only memory 115 typically stores various basic functions used by the CPU 105 such as basic input/output processes and startup processes typically referred to as BIOS processes. The read only memory 115 may comprise Flash EEPROM memory cells such as are included in Flash EEPROM 145. If the read only memory is constructed of Flash EEPROM cells, it may be modified by running an update process on the computer system 100 to reprogram the values stored in the read only memory 115.

Also connected to the bus 165 are various peripheral components including long term memory 125. The long term memory 125 is used to store data for access by the computer system 100. Typically, the long term memory 125 is constructed of an electromechanical hard disk drive, however, a Flash EEPROM memory array can be utilized to serve as a long term memory 125 in place of an electromechanical hard drive. Computer system 100 may also utilize floppy disk drive 140 to store and retrieve data, and CDROM drive 135 to retrieve data for use by the system 100.

The computer system 100 interfaces with a user by displaying information on display device 120, printing hard copies of information through the use of a printer controller 150, and accepting data input from a user through keyboard 110. The keyboard 110 may also include a mouse or other well known pointing or data input device. Further, the system 100 may interface with other computers through a LAN interface 155 or a modem 160.

The Flash EEPROM 145 is coupled to the system bus 165, and is controlled by the CPU 105. As stated previously, the Flash EEPROM 145 can be utilized as a memory device for either short or long term memory. The Flash EEPROM 145 includes a Flash EEPROM memory array, a control circuit, a voltage detector, charge pumps and other circuitry as will be more fully described with reference to FIG. 2. The memory array is made up of memory cells which include floating gate field effect transistor (FET) devices. Such memory transistors may be programmed (or erased) to change the charge stored on the floating gate, and the condition of the floating gate may be determined by interrogating the cells.

The computer system 100 may be a portable computer, a workstation, a minicomputer, a programmable digital assistant, a mainframe, or any other type of computer, and the power requirements—which are supplied by power supply 107—of the computer system 100 are defined accordingly. For instance, if the computer system 100 is a workstation, the system supply voltage may be 5.0 volts, wherein if the computer system 100 is a portable computer operating from a rechargeable battery, the system supply voltage may be approximately 3.0 volts. Further, it may be the case that the computer system 100 is a portable computer that provides different operating voltage levels depending on whether power is supplied by the rechargeable battery or by an AC adapter.

Therefore, the power supply 107 includes a supply output for supplying the operating voltage of the computer system 100 to the components of the computer system 100 via power conductors of the system bus 165. Wherein the computer system 100 is a portable computer, the power supply 107 may be a rechargeable battery. The power supply 107 may also include a supply output for supplying a twelve volt programming voltage to the Flash EEPROM 145.

Figure 2:
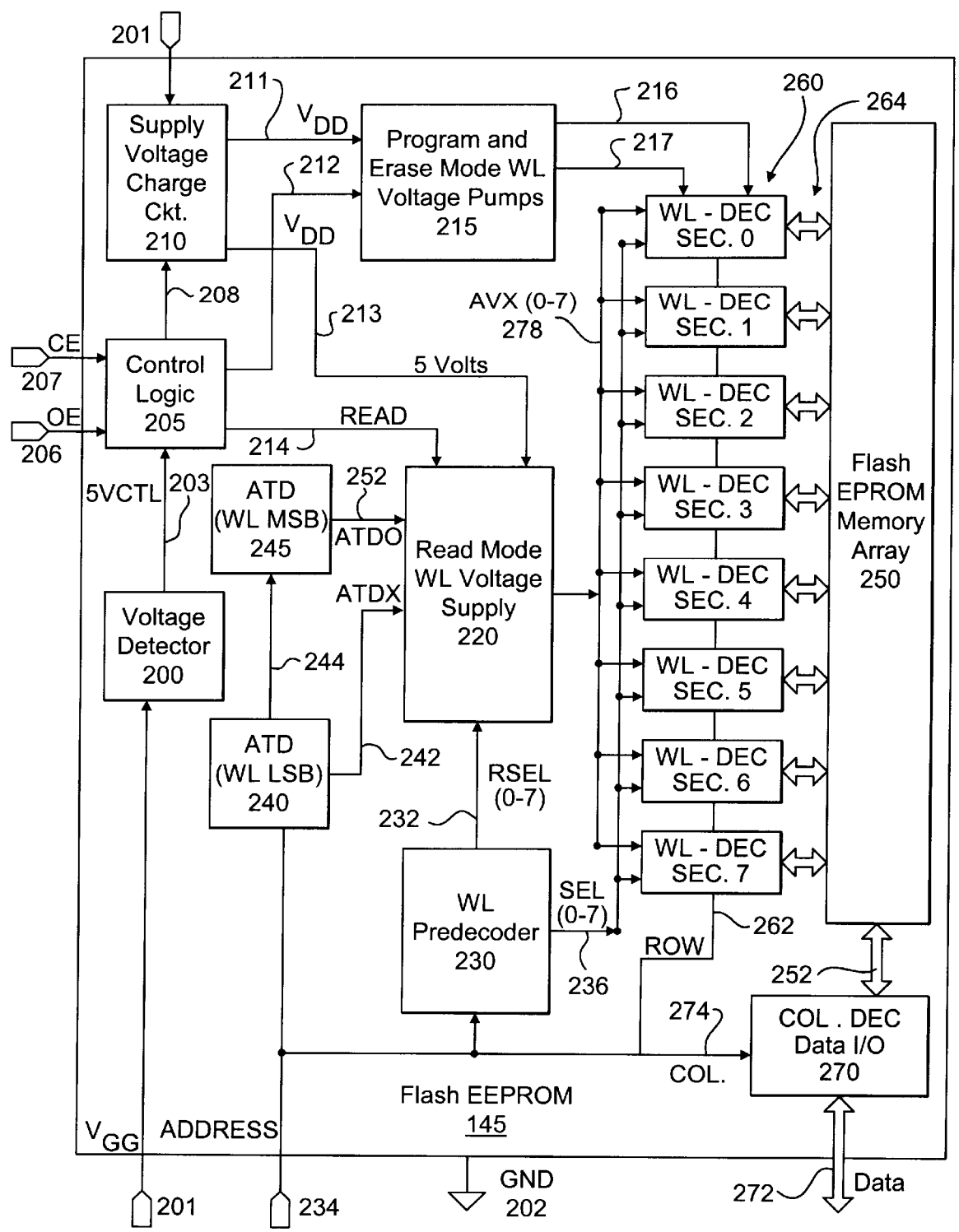
FIG. 2 illustrates, in block diagram form, a flash EEPROM circuit of FIG. 1 that incorporates one embodiment of the present invention, and that includes various charging pump circuits, control circuits, and switches.

FIG. 2 illustrates, in simple block diagram form, one embodiment of the present invention as it is incorporated in the Flash EEPROM 145 of FIG. 1. Thusly, FIG. 2 illustrates an integrated circuit which includes a voltage detector 200, a control logic 205, a supply voltage charge circuit 210, a program and erase mode word line voltage pump circuit 215, a read mode word line voltage supply 220, a word line predecoder 230, a word line decoder 260, a column decoder and data input/output circuit 270, a Flash EEPROM memory array 250, and address transition detectors 240 and 245. The Flash EEPROM 145 illustrated in FIG. 2 also includes a supply voltage input pin 201 adapted to receive a supply voltage $V_{GG}$. As this embodiment of a Flash EEPROM is configured to receive only a single voltage input $V_{GG}$, it must therefore generate a programming voltage $V_{PP}$ in order to function. The supply voltage in one example embodiment is 2.7 to 3.6 volts, and in another embodiment is 5 volts. Also, a ground pin 202 is provided. Other input and output pins are included on the integrated circuit including address inputs 234, control signal inputs such as a chip enable input 207 and an output enable input 206, and data input/output pins 272.

The integrated circuit includes a flash EEPROM memory array 250 which includes a plurality of word lines represented for example by the arrows 264. The word lines are driven by a word line decoder 260 that includes a plurality of sections, including word line decoder section 0, word line decoder section 1, word line decoder section 2, word line decoder section 3, word line decoder section 4, word line decoder section 5, word line decoder section 6, and word line decoder section 7 in this example. Also, a column decoder and data input/output circuit 270 is coupled to a plurality of bit lines represented by arrows 252 in the memory array 250. The column decoder 270 and the word line decoder 250 are controlled by addresses received from the address inputs 234. The address can be characterized as including row addresses on line 262 and column addresses on line 274 which drive the word line decoder 260 and the column decoder 270 respectively. Also, a word line predecoder 230 is included which is coupled to the address line 234. The word line predecoder 230 generates select control signals SEL(0–7) on line 236 which are supplied respectively to the word line decoder sections 0–7. Three of the more significant bits of the row address portion of the address on line 234 are used to control the word line predecoder 230 and select a particular word line decoder section from the word line decoder 260. The word line predecoder 230 also generates control signal RSEL(0–7) on line 232.

Control logic 205 is also included on the chip. The control logic 205 receives the chip enable and chip select signals on lines 207 and 206, as well as other signals in order to control the mode of operation of the flash memory. A voltage detector 200 receives input voltage $V_{GG}$ on line 201 and is configured to produce an output signal 5VCTL on line 203 that is operably related to the level of the supply voltage $V_{GG}$. The control logic 205 receives the output signal 5VCTL of the voltage detector 200 on line 203, and in turn controls the operation of the supply voltage charge circuit 210 by providing an input to the supply voltage charge circuit 210 on line 208. The supply voltage charge circuit 210 receives an input from the control logic 205 on line 208, and supply voltage $V_{GG}$ on line 201. The supply voltage charge circuit 210 utilizes the control logic input on line 208 to manipulate the supply voltage $V_{SS}$ to produce an output system operating voltage $V_{DD}$ that is substantially 5 volts. For instance, in one embodiment, if $V_{GG}$ is 2.7–3.6 volts then the supply voltage charge circuit 210 will pump the supply voltage $V_{GG}$ to 5 volts using charge pump circuitry that is known in the art. This 5 volt $V_{DD}$ is then provided to the read mode word line voltage supply 220 on line 213, and to the program and erase mode word line voltage pump circuit 215 on line 211.

Flash memory devices include a read mode, a program mode, an erase mode, and other modes as suits a particular implementation for program and erase operations. The voltage levels that are necessary to perform program and erase functions are provided by program and erase mode word line voltage pumps 215 that are provided with a 5 volt supply on line 211 as stated previously. Control logic 205 controls the function of program and erase mode word line voltage pumps 215 by providing a control signal on line 212. The control signal on line 212 causes the program and erase mode word line voltage pumps 215 to provide the appropriate voltage signals to the word line decoder 260 on lines 216 and 217 in order to perform the program or erase function.

The read mode word line voltage supply circuit 220 receives a 5 volt supply signal on line 213, and in turn supplies an output on line 278 in response to a READ control signal on line 214 that is generated by the control logic 205. The read mode word line voltage supply circuit 220 is also responsive to address transition detection circuits 240 and 245. The address transition detection circuit 245 generates a signal on line 252 which indicates the transition of the three more significant bits of the row address which are used to select a particular word line decoder section. Thus the signal ATD0 on line 252 indicates a transition between word line decoder sections in the word line decoder 260. The address transition detection circuit 240 is responsive to the less significant bits in the row address to indicate a transition between word lines. Thus the output ATDX on line 242 indicates a transition between word lines within a particular word line decoder section. The output of the read mode word line supply circuit 220 includes eight word line voltages AVX(0–7) on line 278 for the respective word line decoder sections. The read mode word line voltage supply 220 may also contain circuitry to further pump, boost and stabilize the input voltage to ensure a more consistent 5 volt output. Circuitry of this kind is disclosed in PCT Pat. Application No. PCT/US97/21513 entitled, "On Chip Voltage Generation for Low Power Integrated Circuits," invented by Kuen-Long Chang, and assigned to the assignee of the present application, which is hereby incorporated by reference.

Thus, the present invention is applied as shown in FIG. 2 for supply voltage detection and word line voltage generation for the program, erase and read modes of a flash memory device. According to this embodiment, the supply voltage charge circuit 210 operates to ensure that there is a constant 5 volt power supply available to the Flash EEPROM 145. This 5 volt operating voltage $V_{DD}$ may then be utilized to provide read mode voltage levels and as an input to charge pump circuitry to provide the higher voltages necessary for programming and erasing the Flash EEPROM memory array 250. In the embodiment illustrated, the voltage detector 200 senses whether the external power supply is either a 3 volt or a 5 volt power supply and in response to the detected level, supplies a control signal 5VCTL to the control logic 205.

In one embodiment, the voltage detector 200 asserts an output control signal 5VCTL on line 203 with a predetermined state when the supply voltage $V_{GG}$ is above a predetermined voltage of interest. When the supply voltage $V_{GG}$ is not above the predetermined voltage of interest, the predetermined state of the control signal 5VCTL is disasserted. For instance, in one embodiment, the control signal 5VCTL asserted by the voltage detector 200 is a CMOS logic level signal, that indicates whether the supply potential is greater than or equal to 4.5 volts or other predetermined level for a regulated external 5 volt power supply. This signal can be either a logic high ("1") or low ("0") when the input voltage $V_{GG}$ is greater than or equal to 4.5 volts or any other predetermined voltage level. In this embodiment, the control logic 205 responds to the CMOS logic level signal output corresponding to a detected voltage greater than or equal to 4.5 volts by providing a control signal to the supply voltage charge circuit 210 that causes the supply voltage to not be pumped in the supply voltage charge circuit 210. If the input voltage $V_{GG}$ is less than 4.5 volts, the CMOS logic level output of the voltage detector 200 causes the control logic 205 to provide a control signal to the supply voltage charge circuit 210 that enables charging pump circuitry within the supply voltage charge circuit 210 to pump the supply voltage $V_{GG}$ to 5 volts on lines 211 and 213.

In another embodiment, the voltage detector 200 asserts an output control signal 5VCTL on line 203 with a predetermined state when the supply voltage $V_{GG}$ is below a predetermined voltage of interest. When the supply voltage $V_{GG}$ is not below the predetermined voltage of interest, the predetermined state of the control signal 5VCTL is disasserted. For instance, the control signal 5VCTL asserted by the voltage detector 200 may also be a CMOS logic level signal, that indicates whether the supply potential is less than or equal to 3.6 volts or other predetermined level for a regulated external power supply falling in the range of 2.7–3.6 volts. This signal can be either a logic high ("1") or low ("0") when the input voltage $V_{GG}$ is greater than or equal to 3.6 volts or any other predetermined voltage level that identifies the input voltage $V_{GG}$ as from a 3.0 volt power supply. The embodiments of the voltage detector 200 discussed above are not exhaustive of the types of control signals that the voltage detector 200 could supply to perform its function. Any control signal that is capable of representing the present existence of one of two possible states of an input supply voltage, such as a TTL level signal, will work with a control logic 205 that is adapted to receive and utilize the given control signal.

Figure 3:
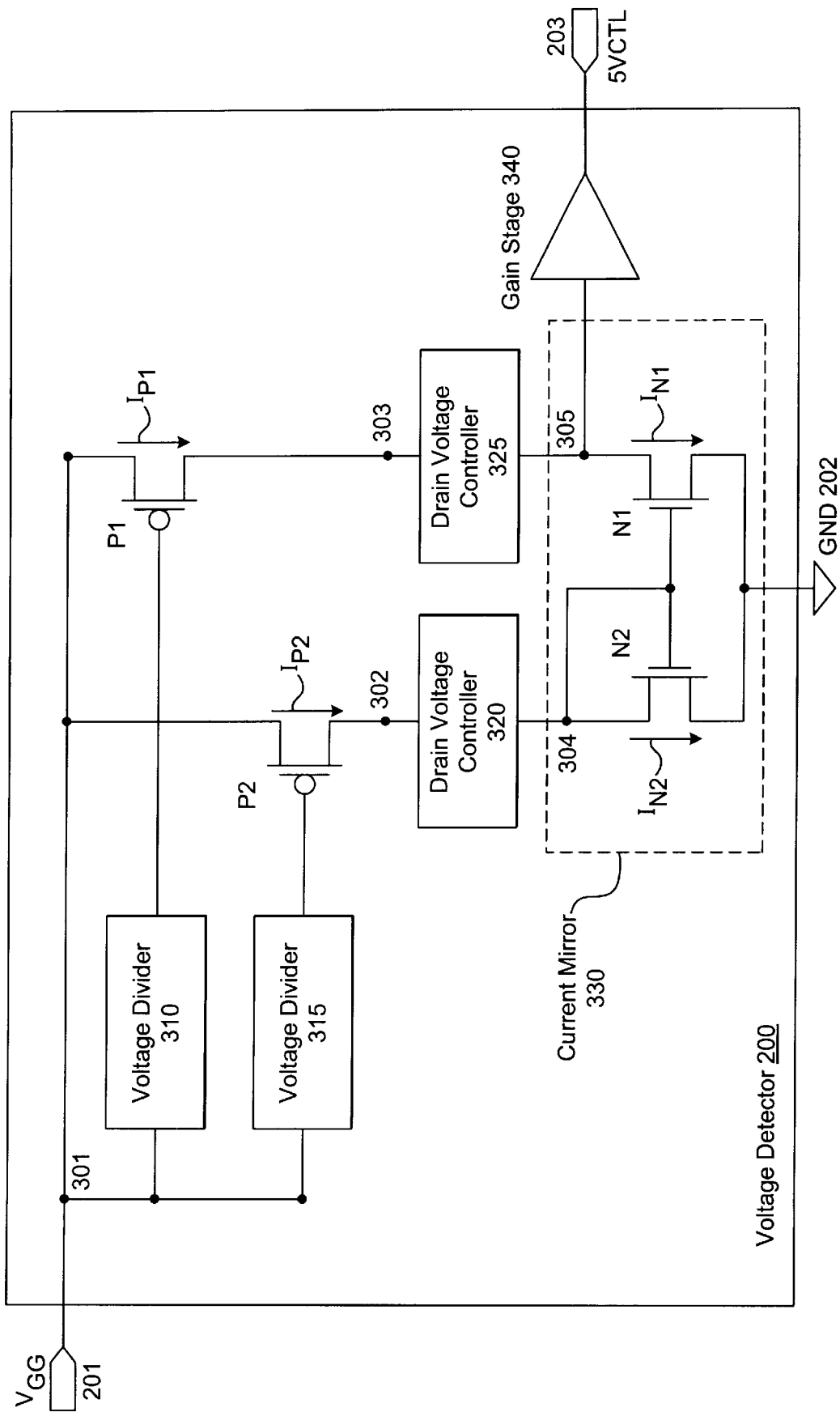
FIG. 3 illustrates, in simplified form, one embodiment of the voltage detector circuit shown in FIG. 2.
Figure 4:
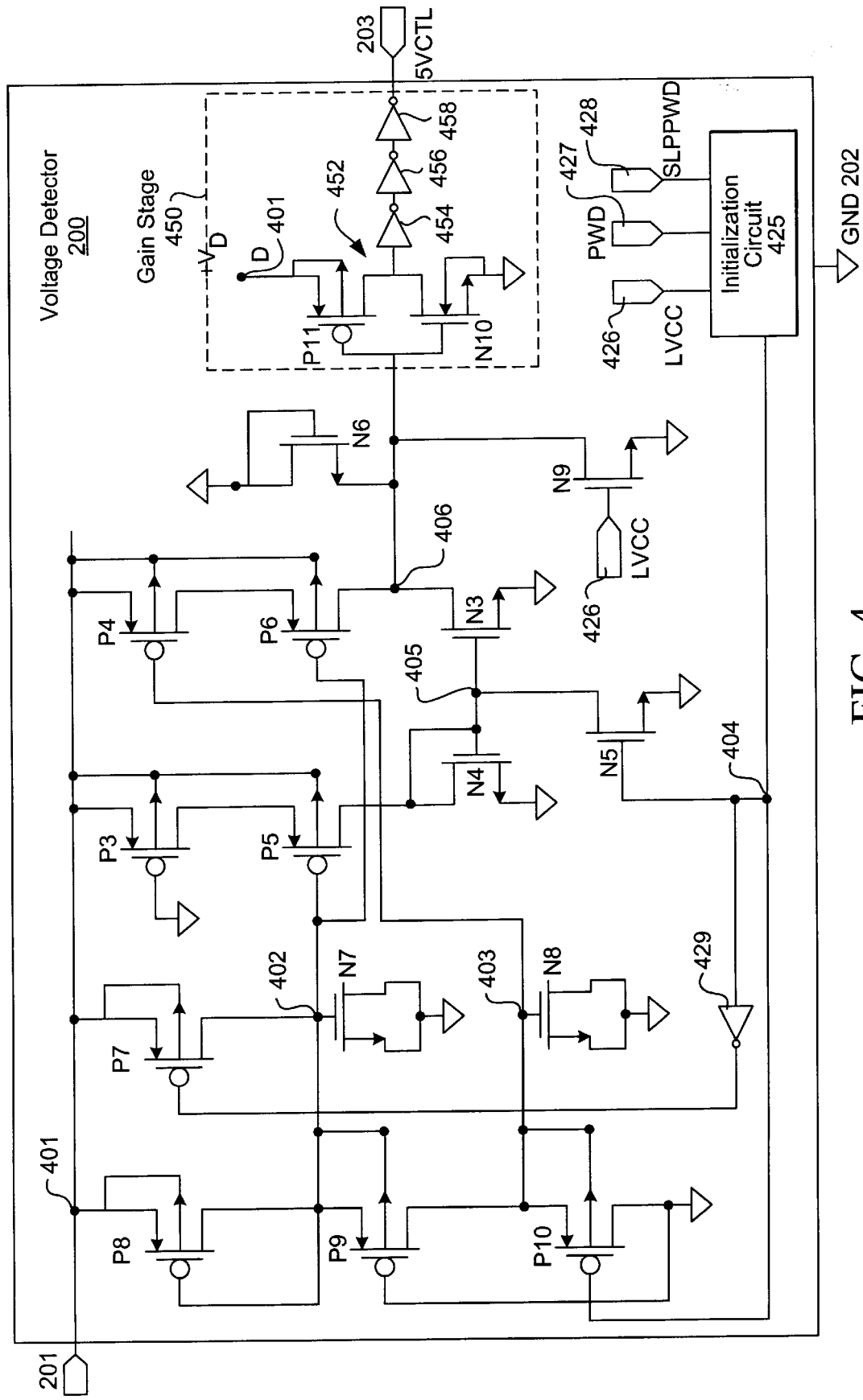
FIG. 4 illustrates, in detailed schematic form, one embodiment of the voltage detector circuit of FIG. 3.

Turning now to a description of the voltage detector 200 of FIG. 2 as it is illustrated in FIGS. 3 and 4, the devices which comprise an embodiment of voltage detector 200 are fabricated using metal-oxide-semiconductor (MOS) processing. The source and drain of the p-type devices are formed of small p+ diffusions in an n-doped substrate well to which electrodes are applied. Since the source and drain may be reversed by reversing the bias connection, it is convenient to refer in a p-channel device to the most positively biased contact as the "source", while the less positively biased contact is referred to as the "drain." Conduction between source and drain arises by the inducement of a p-channel in the n material immediately under the insulating gate. Conduction occurs when the gate goes negative with respect to the source by an amount in excess of the device threshold voltage (ie. when $V_{GS}<V_{TH}$). This allows conduction by the creation of majority carriers (positive holes) between the source and drain electrodes.

The n-type devices are formed of two electroded n+ diffusions in a p-doped substrate well that form the source and drain respectively and spaced apart so that an insulated gate may be applied over the region between the two diffusions. As in the case of the p-channel device, the source and drain electrodes of an n-channel device may also be reversed. The source electrode is defined as the more negatively biased and the drain as the less negatively biased electrode. The n-channel device is turned on by the application of a positive potential to the gate which induces majority charges (electrons) in the n-channel. Conduction occurs when the positive potential applied to the gate, measured with respect to the source, exceeds the device threshold voltage (ie. when $V_{GS}>V_{TH}$).

In an equivalent embodiment, the transistor devices illustrated in FIGS. 3 and 4 are fabricated using complimentary metal-oxide-semiconductor (CMOS) technology. In this case, the n-type devices are formed in a p-substrate and p-type devices are formed in n-wells, the n-wells being first formed in the p-substrate. The n-wells are reverse biased with respect to the p-substrate in order to prevent any current flow across the p-n junction formed by the n-well of each p-type device.

FIG. 3 illustrates the voltage detector 200 of FIG. 2 in simplified block diagram form. The voltage detector 200 includes voltage dividers 310 and 315, p-channel transistor devices P1 and P2, drain voltage controllers 320 and 325, current mirror 330, and gain stage 340. Supply voltage $V_{GG}$ is provided to the voltage detector 200 at supply voltage input pin 201. The control signal 5VCTL output of the voltage detector 200 is provided at pin 203, and system ground pin 202 is also provided.

The elements of one embodiment of voltage detector 200 are connected as described below. The supply voltage $V_{GG}$ on pin 201 is provided to the input of voltage dividers 310 and 315 via node 301. $V_{GG}$ is also provided to the sources of both p-channel devices P1 and P2. The output of voltage divider 310 is provided to the gate of P1 and the output of voltage divider 315 is provided to the gate of P2. The drain of P1 is connected to node 303 which is connected to the input of drain voltage controller 325. The output of drain voltage controller 325 is connected to node 305 which is connected to the output of current mirror 330. The drain of P2 is connected to node 302 which is connected to the input of drain voltage controller 320. The output of drain voltage controller 320 is connected to node 304 which is connected to the input of current mirror 330. The current mirror 330 consists of n-channel transistor devices N1 and N2. The drain and gate of n-channel transistor N2 is connected to node 304 which is also connected to the gate of n-channel transistor N1. The sources of N1 and N2 are connected to ground through ground pin 201, and the drain of N1 is connected to node 305. Finally, the input of gain stage 340 is also connected to node 305, and the output of gain stage 340 is provided on output pin 203 as control signal 5VCTL.

The voltage dividers 310 and 315 are configured to divide the supply voltage $V_{GG}$ such that they provide a predetermined ratio of the supply voltage level to the gates of their respective transistor devices P1 and P2. The voltage dividers 310 and 315 may consist of transistors configured as resistive devices in series as described with respect to FIG. 4. In general, transistors act as resistive devices when their lengths are much greater than their widths (on the order of ten times for instance). By varying the sizes of the transistors used in the voltage dividers 310 and 315, one can adjust the voltage drops across the resistive devices and tap an output at a level that is a predetermined ratio of the input supply. In one embodiment, only one voltage divider 310 is provided, and a unity of the supply voltage, or ground, is provided directly to the gate of transistor P2—this is illustrated further in FIG. 4.

The p-channel devices P1 and P2 have the same threshold voltage $V_{TH}$ and aspect ratio, and are identical in all respects in one embodiment of the invention. In other embodiments, P1 and P2 may have the same $V_{TH}$ but a different aspect ratio, P1 and P2 may have the same aspect ratio but a different $V_TH$, or P1 and P2 may have both a different aspect ratio and a different $V_{TH}$. In still another embodiment of the invention, P1 and P2 may be n-channel devices. The $V_{TH}$ of a transistor device is determined by a number of factors which can be altered. One such factor that can be altered is the doping concentration of the p-type source and drain terminals of a p-channel transistor. Further, different p-type material can be used for the source and drain terminals of a particular transistor to alter the $V_{TH}$ of this transistor as compared to other transistors in the circuit. The term aspect ratio is used here to refer to the ratio of a transistor's width (W) to its length (L) (ie. aspect ratio=W/L).

The drain voltage controllers 320 and 325 may consist simply of a transistor device with a known voltage drop such that the drain voltages of P1 and P2 may be predicted in a consistent manner given a certain supply voltage $V_{GG}$. In one embodiment of the invention the drain voltage controllers 320 and 325 consist of transistors configured as cascode devices as shown in FIG. 4. In another embodiment of the invention, the drain voltage controllers may be left out entirely, and the drains of P1 and P2 may be connected directly to the output and input of the current mirror 330 respectively.

The gain stage 340 consists of an amplification circuit that is used to boost the output signal of the current mirror 330. In one embodiment, the amplification circuit consists of a series of CMOS inverters, each of which converts a CMOS low (approximately <1.5 volts) input into a CMOS high (approximately >3.5 volts), and a CMOS high input into a CMOS low output as described more fully below with respect to FIG. 4. The gain stage 340 may be configured such that a low voltage output from the current mirror 330 produces a "high" control signal 5VCTL or vice-versa. Therefore, the voltage detector 200 may be configured such that in one embodiment the control signal 5VCTL is a CMOS low when the $V_{GG}$ is low and is a CMOS high when $V_{GG}$ is high, and vice-versa in another embodiment.

Prior to discussing the overall operation of voltage detector 200, the operation of current mirror 330 will first be explained in some detail. As stated above, the current mirror 330 consists of n-channel devices N1 and N2 configured such that the drain of N2 is connected to the gates of both N2 and N1. In one embodiment, N1 and N2 have the same size or aspect ratio and threshold voltage $V_{TH}$, while in another embodiment the size ratios and/or $V_{TH}$ are different. In another embodiment, N1 and N2 may be p-channel devices.

In analyzing the operation of the current mirror 330, assume that the channel length and width of N1 are $L_1$ and $W_1$ respectively, and the channel length and width of N2 are $L_2$ and $W_2$. Further, let it be assumed that the current mirror operates in a saturation state and that the current entering into the input terminal at node 304 is $I_{N2}$. The current mirror 330 provides or flows a current $I_{N1}$ shown in equation(1) as illustrated in FIG. 3.

$$I_{N1}=(W_1/L_1)/(W_2/L_2) \times I_{N2} \quad (1)$$

If the size ratio of N1 and N2 is set to 1 [$(W_1/L_1):(W_2/L_2)=1:1$], then the current $I_{N1}$ will be equal to the input current $I_{N2}$. This is so because the drain current $I_D$ through an n-channel transistor is directly related to the voltage between the gate and source ($V_{GS}$) when the transistor is in the active (saturated) region of its operation according to equation (2).

$$I_D=K(V_{GS}-V_{TH})^2 \quad (2)$$

Since transistors N1 and N2 have the same aspect ratio, $V_{TH}$, and $V_{GS}$, then the current through each will be equal assuming again that N1 and N2 are in the active region. Whether or not N1 and N2 are in the active region can be determined in accordance with equation (3) in which $V_{DS}$ is the drain to source voltage of the transistor.

if $V_{DS}<V_{GS}-V_{TH}$, then transistor in ohmic region if $V_{DS}>V_{GS}-V_{TH}$, then transistor in active region    (3)

However, if the current $I_{P1}$ flowing through p-channel device P1 is less than the current $I_{P2}$ flowing through the p-channel device P2, and therefore less than the current $I_{N2}$ as well, then the current mirror 330 will not be able to exactly mirror the current $I_{N2}$ through n-channel device N1. This can be seen using simple circuit analysis with respect to FIG. 3 in which it is clear that the current through N1 is effectively equal to the current through P1 (further, it is of note that gain stage 340 is a high gain amplifier circuit with a high impedance input and effectively draws no current). Therefore, as the current through devices P1 and N1 is lowered with respect to the current through devices P2 and N2 while the $V_{GS}$ for N1 and N2 remains constant, the device N1 will eventually leave the active region of its operating curve and enter the ohmic region at a point established by equation (3) above. When in the ohmic region, it can be shown that the drain current through the transistor N1 is in accordance with equation (4).

$$I_D=K[2(V_{GS}-V_{TH})V_{DS}-V_{DS}^2] \quad (4)$$

where the constant K ideally has the same value as for its active region operation. For the case that $V_{DS}$ is small, equation (4) can be approximated by equation (5).

$$I_D \approx K[2(V_{GS}-V_{TH})V_{DS}] \text{ or } I_D/V_{DS} \approx 2K(V_{GS}-V_{TH}) \quad (5)$$

Thus, as can be seen from equation (5), for small values of $V_{DS}$, an n-channel transistor operating in the ohmic region—such as the case here for N1 when $I_{P1}<I_{P2}$—behaves as a linear resistor with an approximate value of drain-source resistance $R_{DS}$ given by equation (6).

$$R_{DS}=V_{DS}/I_D \approx 1/2K(V_{GS}-V_{TH}) \quad (6)$$

Finally, by rearranging equation (6) to formulate equation (7), one can see that for a transistor operating in the ohmic region with a given $V_{GS}$ and $V_{TH}$, the $V_{DS}$ decreases in a roughly linear manner as $I_D$ decreases.

$$V_{DS} \approx I_D/2K(V_{GS}-V_{TH}) \quad (7)$$

Thus, with respect to voltage detector 200, as $I_{P1}$ becomes smaller in value with respect to $I_{P2}$, the $V_{DS}$ of N1 becomes smaller in accordance with equation (7) above. Since the source voltage is fixed at ground level, then as $V_{DS}$ decreases, the value of the drain voltage, which is also the voltage level of output node 305, decreases. In one embodiment, the appropriate values of the circuit elements of FIG. 3 are chosen such that when the supply voltage $V_{GG}$ is at a level corresponding to the minimum voltage expected from a 5 volt power supply (≈4.5 volts), the voltage level at node 305 will be at least as great as the minimum level corresponding to a CMOS logic high (≈3.5 volts). Thus, in this embodiment when the $V_{GG}$ is from a 5 volt supply, the input to the gain stage is a logic high, and the output control signal 5VCTL can be either high or low depending upon the number of inverters used in the gain stage 340. When the input supply voltage $V_{GG}$ is from a 3 volt power supply, the voltage level at node 305 will be even lower than when $V_{GG}$ is from a 5 volt supply, and at a level corresponding to a CMOS logic low.

In another embodiment, the appropriate values of the circuit elements are chosen such that when the supply voltage $V_{GG}$ is at a level corresponding to the maximum voltage expected from a 3 volt power supply (≈3.6 volts), the voltage level at node 305 will be less than the highest level corresponding to a CMOS logic low (≈1.5 volts). Thus, in this embodiment, when the $V_{GG}$ is from a 3 volt supply, the input to the gain stage is a logic low, and the output control signal 5VCTL can be either high or low depending upon the number of inverters used in the gain stage 340. When the input supply voltage $V_{GG}$ is from a 5 volt power supply, the voltage level at node 305 will be higher than when $V_{GG}$ is from a 3 volt supply, and at a level corresponding to a CMOS logic high.

In choosing the values of the circuit elements of FIG. 3 that will accomplish the results indicated above, it would be understood by one skilled in the art that many combinations of the following mechanisms for adjusting the current through the MOS devices P1 and P2 could produce the desired results. First, note that it is the voltage at node 305 which ultimately determines what the output of the voltage detector 200 will be. Whenever the currents $I_{P1}$ and $I_{P2}$ through transistor devices P1 and P2 respectively are equal—assuming P1 and P2 are identical and given a supply voltage $V_{GG}$—then the voltage at node 305 will remain steady and fixed. When the current $I_{P1} < I_{P2}$, then the transistor N1 slowly enters the ohmic region as the difference increases, causing the voltage at node 305 to decrease. Therefore, it is clear that by utilizing a particular mechanism for adjusting the difference in currents $I_{P1}$ and $I_{P2}$ for a set of expected input supply voltages, one can effectively set the voltage level at node 305 at predetermined levels for each of those expected input voltages. This difference in current can be established in a number of different ways, and thus a number of mechanisms for adjusting the current through P1 and P2 can be identified by considering the factors which determine the current through a transistor such as P1 and/or P2. Given a particular source voltage which in this case is $V_{GG}$, the currents $I_{P1}$ and $I_{P2}$ are determined by the aspect ratios of P1 and P2, the voltage thresholds $V_{TH}$ of P1 and P2, the gate voltages of P1 and P2, and by the drain voltages of P1 and P2. Thus, a mechanism for adjusting the current through P1 and P2 can consist of circuitry that adjusts any one of the above factors, or any of the factors in a combination such that the desired output at node 305 is realized for the range of input voltages expected.

Thus, for instance, if the range of possible supply voltages is known, one could design the circuit of FIG. 3 by choosing P1 and P2 as identical transistors and adjusting the drain voltage of each in a similar manner as illustrated with respect to the embodiment of the invention in FIG. 4 below. Thus, the design of the rest of the circuit would be simplified, as only the value to which to adjust the gate voltages of P1 and P2 would have to be determined. In this case the mechanism for adjusting the current through P1 and P2 could consist of using voltage dividers as the bias circuits for P1 and P2 to adjust the gate voltages of P1 and P2. Using the operational curves for transistors P1, P2, N1, and N2, one could determine the appropriate level of voltage division needed in voltage dividers 310 and 315 to produce the desired result. In the embodiment illustrated in FIG. 4 to be described below, the voltage level at the gate of P2 is held fixed while the voltage level at the gate of P1 is adjusted to be a predetermined ratio of the supply voltage.

FIG. 4 illustrates a circuit level schematic of one embodiment of the voltage detector 200 described above with respect to FIGS. 2 and 3. The embodiment of voltage detector 200 depicted in FIG. 4 is implemented on a single integrated circuit which also includes the elements of Flash EEPROM 145 that are illustrated in FIG. 2. As discussed above with respect to FIG. 3, the embodiment of the invention illustrated here accomplishes the desired result by adjusting the relative gate voltages of identical (in aspect ratio and $V_{TH}$) p-channel transistors P3 and P4 which correspond to transistors P2 and P1 of FIG. 3 respectively.

Referring to FIG. 4, the voltage detector 200 has an external voltage supply $V_{GG}$ input pin 201, a system ground pin 202 that is coupled to an external ground, and various other input pins as explained previously with reference to FIG. 2. The supply voltage $V_{GG}$ is provided on input pin 201 to node 401 which is coupled to the source and substrate of p-channel devices P3 and P4. The gate of p-channel device P3 is coupled to system ground, and the gate of P4 is coupled to node 403 which supplies a predetermined ratio of the supply voltage $V_{GG}$ via p-channel transistors P8, P9, and P10 which are configured as a voltage divider. The drain of P3 is coupled to the source of p-channel device P5, and the drain of P4 is coupled to the source of p-channel device P6. In the embodiment illustrated, the p-channel devices P3 and P4 are identical in both aspect ratio and $V_{TH}$. The gates of transistor devices P5 and P6 are coupled to node 402 which supplies a ratio of the supply voltage $V_{GG}$ to the gates of P5 and P6 to ensure that both P5 and P6 are turned on when system operating power is available. The drain of P5 is connected to the input node 405 of the current mirror consisting of n-channel transistors N3 and N4, while the drain of P6 is coupled to the output node 406 of the current mirror. Transistor devices P5 and P6 are configured as cascode devices in order to make the circuit less susceptible to process variations, and, in this embodiment, P5 and P6 are identical in both aspect ratio and $V_{TH}$.

Referring back to the current mirror 330 of FIG. 3, n-channel transistors N3 and N4, which in this embodiment are identical in aspect ratio and $V_{TH}$, are configured as a current mirror in the same manner as transistors N1 and N2 of FIG. 3. The drain and gate of N4 are coupled to node 405 which is in turn also coupled to the gate of N3. The sources of both N3 and N4 are connected to system ground, and the drain of N3 is coupled to the output node 406 of the current mirror. Also connected to node 405 is the drain of n-channel pass transistor 405 which is used for circuit initialization and stabilization. The source of N5 is coupled to system ground, and the gate of N5 is coupled to node 404. When the Flash EEPROM 145 of FIG. 2 is not ready for operation the output of the initialization circuit 425, which is provided to node 404, is high. Conversely, when the Flash EEPROM 145 is ready for operation the output of the initialization circuit 425 is low. Thus, when the system is not ready and the level of node 404 is high, the pass transistor N5 is turned on to disrupt the normal operation of the current mirror, and provide for a consistent output when the system is in an unstable or unready condition. The initialization circuit 425 may provide a high output for a number of reasons such as a low detected $V_{CC}$ (LVCC), system entering a power down mode (PWD), or system entering a standby low power mode (SLPPWD). Thus, in the embodiment illustrated in FIG. 4, the initialization circuit 425 is shown with input pins 426, 427, and 428 for each of the above conditions.

Turning back to the operation of the current mirror portion of the circuit, the output node 406 is coupled to the drain of n-channel transistor device N6, which is configured to operate as a diode voltage clamp to help stabilize the overall operation of the circuit. Accordingly, the gate of N6 is connected to its source which is in turn coupled to system ground. Also coupled to node 406 is the drain of n-channel pass transistor N9 which is provided to stabilize the circuit when the circuit is unready because of a low $V_{CC}$ condition. The gate of N9 is coupled to input pin 426 which provides an output that is high when the Flash EEPROM 145 detects a low $V_{CC}$ condition, and the source of N9 is coupled to system ground.

Also illustrated are p-channel transistor devices P8, P9, and P10 which are configured as a voltage divider to supply a predetermined ratio of the supply voltage $V_{GG}$ to node 403 and the gate of P4. The supply voltage $V_{GG}$ at node 401 is coupled to the source and substrate of P8, and the drain and gate of P8 are coupled to node 402. The source and substrate of device P9 are coupled together also at node 402, and the gate of P9 is coupled to ground. The drain of device P9 is coupled to node 403 which is also coupled to the source and substrate of p-channel device P10. The drain of device P10 is coupled to ground, and the gate of P10 is coupled to node 404 the signal level of which is determined by the initialization circuit 425 as discussed above. When the Flash EEPROM is ready for operation the level at node 404 is low thus turning on transistor P10. Conversely, when the Flash EEPROM 145 is not ready for operation, the level at node 404 is high and P10 is cutoff thus preventing the normal, steady state operation of the voltage detector 200.

Also included in the voltage detector depicted in FIG. 4 are n-channel transistors N7 and N8, and p-channel transistor device P7. These transistors are included to provide the circuit with stabilization when operating at steady state, and to initialize the circuit when the Flash EEPROM 145 is in a not ready for operation condition as discussed above. The source and substrate of P7 are coupled to $V_{GG}$ through node 401, and the drain of P7 is coupled to node 402. The gate of p-channel device P7 is coupled to the output of CMOS inverter 429, and the input of inverter 429 is coupled to the output of initialization circuit 425 at node 404. When the initialization circuit 425 indicates a not ready condition, the level at node 404 is low and the voltage at the gate of P7 is high thereby turning off device P7. N-channel devices N7 and N8 are connected as capacitors to increase circuit stability. The drain and source of N7 are coupled together to system ground, and the drain and source of N8 are coupled similarly. The gate of device N7 is coupled to node 402, and thus N7 helps to ensure that cascode devices P5 and P6 remain turned on when the Flash EEPROM 145 is in a ready condition. The gate of device N8 is coupled to node 403, and thus N8 helps to ensure that p-channel device P4 remains turned on when the circuit is in a ready condition.

The output of the circuit is control signal 5VCTL which is provided at the output of gain stage 450 on pin 203. The gain stage illustrated in FIG. 4 consists of a series of four CMOS inverters (452, 454, 456, and 458), the first of which is coupled to the current mirror output node 406. The construction of the CMOS inverters 452, 454, 456, and 458 is illustrated with respect to inverter 452, which consists of p-channel transistor device P11, and n-channel transistor device N10. The gates of P11 and N10 are coupled together and to node 406. The source and substrate of N10 are coupled to ground, and the source and substrate of P11 are coupled to a 5 volt supply $V_{DD}$. The drains of N10 and P11 are coupled together to form the output of the CMOS inverter 452. In operation, when the voltage level at node 406 is at a CMOS low level, the transistor N10 is turned off, and the transistor P11 is turned on thereby pulling the output high. When the voltage level at node 406 is at a CMOS high level, the transistor N10 is turned on, and the transistor P11 is turned off thereby pulling the output low. Therefore, the gain stage 450 of the embodiment of the invention illustrated in FIG. 4 operates as follows: When the supply voltage is detected to be from a 3.0 volt supply, and the voltage at node 406 is thereby at a CMOS low level, the ultimate output of the circuit, control signal 5VCTL, will also be low after being operated upon by the four inverters of gain stage 450. Similarly, when the supply voltage is detected to be from a 5.0 volt supply, and the voltage at node 406 is thereby at a CMOS high level, the ultimate output of the circuit, control signal 5VCTL, will also be high after being operated upon by the four inverters of gain stage 450.

Although illustrative embodiments of the invention have been described in detail herein with reference to the accompanying drawings, it is to be understood that the invention is not limited to those precise embodiments. They are not intended to be exhaustive or to limit the invention to the precise forms disclosed. For instance, a circuit similar in operation to the circuit described with respect to FIG. 4 could be constructed using n-channel devices in place of p-channel devices P3 and P4, and using p-channel devices in place of the n-channel devices N3 and N4 which make up the current mirror 330. As such, many modifications and variations will be apparent to practitioners skilled in this art. Accordingly, it is intended that the scope of the invention be defined by the following claims and their equivalents.

What is claimed is:

1. A voltage detector circuit for determining the potential of a supply voltage that is provided on a first input node, the voltage detector circuit comprising:

a first MOS device operably coupled to the first input node and configured such that a first current flows through the first MOS device;

a second MOS device operably coupled to the first input node and configured such that a second current flows through the second MOS device;

a bias circuit coupled to the first MOS device and the second MOS device, wherein the bias circuit acts in combination with the first MOS device and the second MOS device to affect the level of the first current and the level of the second current in response to the potential of the supply voltage such that when the potential of the supply voltage is greater than a first potential the difference between the level of the first current and the level of the second current comprises a first current difference, and when the potential of the supply voltage is less than the first potential the difference between the level of the first current and the level of the second current comprises a second current difference that is greater than the first current difference;

a drain voltage controller circuit coupled to the first MOS device and the second MOS device and to the output circuit, wherein the drain voltage controller circuit acts in combination with the bias circuit to equalize voltages on first and second MOS devices; and an output circuit that receives the first current and the second current and generates an output signal that indicates the potential of the supply voltage in response to the difference between the level of the first current and the level of the second current.

2. The voltage detector of claim 1 wherein the bias circuit comprises a voltage divider circuit configured to provide a first ratio of the potential of the supply voltage to the gate of the first MOS device and to provide a second ratio of the potential of the supply voltage to the gate of the second MOS device.

3. The voltage detector of claim 2 wherein the voltage divider circuit comprises MOS transistors.

4. The voltage detector of claim 1 wherein the first MOS device comprises a p-channel MOS transistor characterized by a first gate-source voltage, a first threshold voltage, and a first aspect ratio, and wherein the second MOS device comprises a p-channel MOS transistor characterized by a second gate-source voltage, a second threshold voltage, and a second aspect ratio.

5. The voltage detector of claim 4 wherein the bias circuit comprises a voltage divider circuit configured to provide a first ratio of the potential of the supply voltage to the gate of the first MOS device and to provide a second ratio of the potential of the supply voltage to the gate of the second MOS device such that the first gate-source voltage in absolute value is greater than the second gate-source voltage in absolute value.

6. The voltage detector of claim 4 wherein the first MOS device comprises a first threshold determinant that determines a level of the first threshold voltage, and wherein the second MOS device comprises a second threshold determinant that determines a level of the second threshold voltage, wherein the value of the first threshold voltage is different than the value of the second threshold voltage.

7. The voltage detector of claim 6 wherein the difference between the value of the first threshold voltage and the value of the second threshold voltage comprises a threshold factor which acts in combination with the bias circuit to affect the level of the first current and the level of the second current in response to the potential of the supply voltage.

8. The voltage detector of claim 7 wherein the first threshold determinant comprises a first p-type source and drain terminal doping concentration, and wherein the second threshold determinant comprises a second p-type source and drain terminal doping concentration that is different than the first doping concentration.

9. The voltage detector of claim 7 wherein the first threshold determinant comprises a first p-type source and drain material, and wherein the second threshold determinant comprises a second p-type source and drain material that is different than the first material.

10. The voltage detector of claim 4 wherein the first MOS device comprises a first aspect ratio determinant that determines a level of the first aspect ratio, and wherein the second MOS device comprises a second aspect ratio determinant that determines a level of the second aspect ratio, wherein the value of the first aspect ratio is different than the value of the second aspect ratio.

11. The voltage detector of claim 10 wherein the difference between the value of the first aspect ratio and the value of the second aspect ratio comprises an aspect ratio factor which acts in combination with the bias circuit to adjust the level of the first current and the level of the second current in response to the potential of the supply voltage.

12. The voltage detector of claim 11 wherein the first aspect ratio determinant comprises a first gate width of the first MOS device, and wherein the second aspect ratio determinant comprises a second gate width of the second MOS device.

13. The voltage detector of claim 11 wherein the first aspect ratio determinant comprises a first gate length of the first MOS device, and wherein the second aspect ratio determinant comprises a second gate length of the second MOS device.

14. The voltage detector circuit of claim 1 wherein the output circuit comprises a third MOS device coupled to a fourth MOS device so as to form a current mirror.

15. The voltage detector of claim 14 wherein the third MOS device and the fourth MOS device are n-channel transistors.

16. The voltage detector circuit of claim 14 wherein the output circuit comprises a gain stage electrically coupled to the current mirror, and wherein the gain stage is comprised of at least one CMOS inverter.

17. The voltage detector of claim 16 configured such that when the potential of the supply voltage is greater than the first potential the output signal comprises one of a high CMOS logic signal and a low CMOS logic signal, and when the potential of the supply voltage is less than the first potential the output signal comprises one of a low CMOS logic signal and a high CMOS logic signal respectively.

18. The voltage detector of claim 1 wherein the first potential is approximately 4.5 volts.

19. The voltage detector of claim 1 wherein the first potential is approximately 3.6 volts.

20. A voltage detector circuit of a nonvolatile memory integrated circuit for determining the voltage potential of a supply voltage that is provided on a first input node, the voltage detector circuit comprising:

a first p-channel MOS device configured such that a first MOS current flows through the first p-channel MOS device, the first p-channel MOS device having a source terminal that is electrically coupled to the first input node, a gate terminal that is electrically coupled to ground, and a first drain terminal that is coupled to a first node;

a second p-channel MOS device configured such that a second MOS current flows through the second p-channel MOS device, the second p-channel MOS device having a source terminal that is electrically coupled to the first input node, a gate terminal that is electrically coupled to a first output node, and a second drain terminal that is coupled to a second node;

a voltage divider circuit that is electrically coupled to the first input node and that provides a ratio of the supply voltage on the first output node;

a current mirror circuit comprising:
first n-channel MOS device having a drain terminal and a gate terminal coupled together and to the first node, and a source terminal coupled to ground, and
a second n-channel MOS device having a gate terminal coupled to the first node, a drain terminal coupled to the second node, and a source terminal coupled to ground;
first cascode p-channel MOS device between the first p-channel MOS device and the first n-channel MOS device; and
a second cascode p-channel device between the second p-channel MOS device and the second n-channel MOS device;

wherein the voltage potential at the second node is responsive to the level of the first MOS current and the level of the second MOS current, and the level of the second MOS current is responsive to the level of the ratio of the supply voltage, and further wherein the ratio of the supply voltage is established such that when the voltage potential of the supply voltage is less than a first potential, the voltage potential of the second node is less than a second potential, and such that when the voltage potential of the supply voltage is greater than a third potential, the voltage potential of the second node is greater than a fourth potential.

21. The voltage detector of claim 20 further comprising a gain stage which is electrically coupled to the second node, and wherein the gain stage comprises at least one CMOS inverter configured such that the gain stage provides an output that is responsive to the voltage potential of the second node.

22. The voltage detector of claim 21 wherein the voltage detector circuit comprises MOS devices.

23. The voltage detector of claim 21 wherein the first potential is approximately 3.6 volts, the second potential is approximately 1.5 volts, the third potential is approximately 4.5 volts, and the fourth potential is approximately 3.5 volts.

24. A computer system, comprising:
a system bus;
a central processing unit coupled to the system bus;
a power supply;
a plurality of peripheral devices, each of which being coupled to the system bus; and
a nonvolatile memory integrated circuit coupled to the system bus, wherein the nonvolatile memory further comprises:
  a flash memory array including a plurality of floating gate field effect transistor devices,
  a control logic coupled to the memory array for controlling operations of the memory array,
  an input node that receives a voltage supply from the power supply, and
  a voltage detector that detects the voltage potential of the voltage supply, wherein the voltage detector further comprises:
    a first MOS device operably coupled to the input node and configured such that a first current flows through the first MOS device,
    a second MOS device operably coupled to the input node and configured such that a second current flows through the second MOS device,
    a bias circuit coupled to the first MOS device and the second MOS device, wherein the bias circuit acts in combination with the first MOS device and the second MOS device to affect the level of the first current and the level of the second current in response to the potential of the supply voltage such that when the potential of the supply voltage is greater than a first potential the difference between the level of the first current and the level of the second current comprises a first current difference, and when the potential of the supply voltage is less than the first potential the difference between the level of the first current and the level of the second current comprises a second current difference that is greater than the first current difference,
    a drain voltage controller circuit coupled to the first MOS device and the second MOS device and to the output circuit, wherein the drain voltage controller circuit acts in combination with the bias circuit to equalize voltages on first and second MOS devices; and
    an output circuit that receives the first current and the second current and generates an output signal that indicates the potential of the supply voltage in response to the difference between the level of the first current and the level of the second current.

25. The computer system of claim 24 wherein the bias circuit comprises a voltage divider circuit configured to provide a first ratio of the potential of the supply voltage to the gate of the first MOS device and to provide a second ratio of the potential of the supply voltage to the gate of the second MOS device.

26. The computer system of claim 25 wherein the voltage divider circuit comprises MOS transistors.

27. The computer system of claim 24 wherein the first MOS device comprises a p-channel MOS transistor characterized by a first gate-source voltage, a first threshold voltage, and a first aspect ratio, and wherein the second MOS device comprises a p-channel MOS transistor characterized by a second gate-source voltage, a second threshold voltage, and a second aspect ratio.

28. The computer system of claim 27 wherein the bias circuit comprises a voltage divider circuit configured to provide a first ratio of the potential of the supply voltage to the gate of the first MOS device and to provide a second ratio of the potential of the supply voltage to the gate of the second MOS device such that the first gate-source voltage in absolute value is greater than the second gate-source voltage in absolute value.

29. The computer system of claim 27 wherein the first MOS device comprises a first threshold determinant that determines the level of the first threshold voltage, and wherein the second MOS device comprises a second threshold determinant that determines the level of the second threshold voltage, wherein the value of the first threshold voltage is different than the value of the second threshold voltage.

30. The computer system of claim 29 wherein the difference between the value of the first threshold voltage and the value of the second threshold voltage comprises a threshold factor which acts in combination with the bias circuit to affect the level of the first current and the level of the second current in response to the potential of the supply voltage.

31. The computer system of claim 30 wherein the first threshold determinant comprises a first p-type source and drain terminal doping concentration, and wherein the second threshold determinant comprises a second p-type source and drain terminal doping concentration that is different than the first doping concentration.

32. The computer system of claim 30 wherein the first threshold determinant comprises a first p-type source and drain material, and wherein the second threshold determinant comprises a second p-type source and drain material that is different than the first material.

33. The computer system of claim 27 wherein the first MOS device comprises a first aspect ratio determinant that determines a level of the first aspect ratio, and wherein the second MOS device comprises a second aspect ratio determinant that determines a level of the second aspect ratio, wherein the value of the first aspect ratio is different than the value of the second aspect ratio.

34. The computer system of claim 33 wherein the difference between the value of the first aspect ratio and the value of the second aspect ratio comprises an aspect ratio factor which acts in combination with the bias circuit to affect the level of the first current and the level of the second current in response to the potential of the supply voltage.

35. The computer system of claim 34 wherein the first aspect ratio determinant comprises a first gate width of the first MOS device, and wherein the second aspect ratio determinant comprises a second gate width of the second MOS device.

36. The computer system of claim 34 wherein the first aspect ratio determinant comprises a first gate length of the first MOS device, and wherein the second aspect ratio determinant comprises a second gate length of the second MOS device.

37. The computer system of claim 24 wherein the output circuit comprises a third MOS device coupled to a fourth MOS device so as to form a current mirror.

38. The voltage detector of claim 37 wherein the third MOS device and the fourth MOS device are n-channel transistors.

39. The computer system of claim 37 wherein the output circuit comprises a gain stage electrically coupled to the current mirror, and wherein the gain stage is comprised of at least one CMOS inverter.

40. The computer system of claim 39 wherein the voltage detector is configured such that when the potential of the supply voltage is greater than the first potential the output signal comprises one of a high CMOS logic signal and a low CMOS logic signal, and when the potential of the supply voltage is less than the first potential the output signal comprises one of a low CMOS logic signal and a high CMOS logic signal respectively.

41. The computer system of claim 24 wherein the power supply provides a voltage supply with a potential of approximately 5.0 volts.

42. The computer system of claim 24 wherein the power supply provides a voltage supply with a potential of approximately 3.0 volts.

* * * * *